(12) United States Patent
Kishimoto et al.

(10) Patent No.: US 11,605,775 B2
(45) Date of Patent: Mar. 14, 2023

(54) PIEZOELECTRIC DEVICE

(71) Applicant: Murata Manufacturing Co., Ltd., Nagaokakyo (JP)

(72) Inventors: Yutaka Kishimoto, Nagaokakyo (JP); Shinsuke Ikeuchi, Nagaoka kyo (JP); Masayuki Suzuki, Nagaokakyo (JP); Fumiya Kurokawa, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 241 days.

(21) Appl. No.: 16/907,400

(22) Filed: Jun. 22, 2020

(65) Prior Publication Data
US 2021/0057634 A1    Feb. 25, 2021

(30) Foreign Application Priority Data

Aug. 22, 2019    (JP) .............................. JP2019-151741

(51) Int. Cl.
*H01L 41/083*    (2006.01)
*H01L 41/047*    (2006.01)
*H01L 41/18*    (2006.01)

(52) U.S. Cl.
CPC ........ *H01L 41/083* (2013.01); *H01L 41/0471* (2013.01); *H01L 41/0472* (2013.01); *H01L 41/18* (2013.01)

(58) Field of Classification Search
CPC ............... H01L 41/083; H01L 41/0471; H01L 41/0472; H01L 41/18; H01L 41/27;
(Continued)

(56) References Cited

U.S. PATENT DOCUMENTS 10,979,023 B2 *    4/2021    Shealy ............... H03H 9/02031
2012/0107557 A1 *    5/2012    Akiyama .............. H01L 41/316
204/192.18
(Continued)

FOREIGN PATENT DOCUMENTS

JP    2011-015148 A    1/2011
JP    2013-128267 A    6/2013
(Continued)

OTHER PUBLICATIONS

"Introduction to High Resolution X-Ray Diffraction of Epitaxial Thin Films" by Scott A Speakman, Ph.D. MIT Center for Materials Science and Engineering (Year: 2016).*

*Primary Examiner* — Jarrett J Stark
(74) *Attorney, Agent, or Firm* — Keating & Bennett, LLP (57) ABSTRACT

In a piezoelectric device, electrode layers are spaced apart from each other in the direction of the normal thereto. A first piezoelectric layer is interposed between two electrode layers of electrode layers in the direction of the normal. A second piezoelectric layer is provided on an opposite side of the first piezoelectric layer from a base portion. The second piezoelectric layer is interposed between two electrode layers of the electrode layers in the direction of the normal. The half-width of a rocking curve measured by X-ray diffraction for a lattice plane of the first piezoelectric layer substantially parallel to a first main surface is smaller than a half-width for the second piezoelectric layer. The piezoelectric constant of a material defining the first piezoelectric layer is smaller than the piezoelectric constant of a material defining the second piezoelectric layer.

16 Claims, 5 Drawing Sheets

(58) Field of Classification Search
CPC .............. H01L 41/316; H01L 41/0474; H01L 41/0973; H01L 41/187
See application file for complete search history.

(56) References Cited

U.S. PATENT DOCUMENTS

| | | | | |
|---|---|---|---|---|
| 2012/0293278 | A1* | 11/2012 | Burak | H03H 9/173 333/189 |
| 2013/0127300 | A1* | 5/2013 | Umeda | H03H 3/04 310/365 |
| 2016/0121610 | A1* | 5/2016 | Ashikaga | B41J 2/1646 216/13 |
| 2017/0062696 | A1* | 3/2017 | Iida | B41J 2/1629 |
| 2018/0079210 | A1* | 3/2018 | Ashikaga | B41J 2/14201 |
| 2018/0281021 | A1* | 10/2018 | Ashikaga | B06B 1/0666 |
| 2019/0326873 | A1* | 10/2019 | Bradley | H03H 9/02015 |
| 2022/0040735 | A1* | 2/2022 | Chang | H01L 41/277 |

FOREIGN PATENT DOCUMENTS

| | | |
|---|---|---|
| JP | 2018-093108 A | 6/2018 |
| JP | 2018-137297 A | 8/2018 |

* cited by examiner

PIEZOELECTRIC DEVICE

CROSS REFERENCE TO RELATED APPLICATIONS

This application claims the benefit of priority to Japanese Patent Application No. 2019-151741 filed on Aug. 22, 2019. The entire contents of this application are hereby incorporated herein by reference.

BACKGROUND OF THE INVENTION

1. Field of the Invention

The present invention relates to a piezoelectric device.

2. Description of the Related Art

Japanese Unexamined Patent Application Publication Nos. 2018-137297 and 2018-093108 disclose structures of piezoelectric devices. The piezoelectric device disclosed in Japanese Unexamined Patent Application Publication No. 2018-137297 has a cantilever structure including about two vibrating plates each having a substantially quadrangular shape with about three sides that are free ends and with about one side (supported end) that is supported by a substrate. Each vibrating plate includes a lower piezoelectric thin film, an upper piezoelectric thin film, an electrode thin film, a line electrode, and an additional thin film. Each of the piezoelectric thin films is interposed between about three electrode thin films.

The piezoelectric device disclosed in Japanese Unexamined Patent Application Publication No. 2018-093108 includes a substrate having a front surface and a back surface, a vibrating plate disposed on the front surface of the substrate, and a piezoelectric element disposed on a surface of the vibrating plate remote from the substrate. The vibrating plate is disposed on the substrate. The vibrating plate defines the top of a cavity in the substrate. The piezoelectric element includes a first electrode disposed on the vibrating plate, a first piezoelectric film disposed on the first electrode, a close-contact layer disposed on the first piezoelectric film, a second electrode disposed on the close-contact layer, a second piezoelectric film disposed on the second electrode, and a third electrode disposed on the second piezoelectric film.

Hitherto, multiple piezoelectric layers are stacked from the side of a base portion to produce a piezoelectric device. In the case where the multiple piezoelectric layers are stacked in such a manner that each of the multiple piezoelectric layers is interposed between electrodes, the crystallinity of a piezoelectric layer stacked at a position remoter from the base portion is lower than that of a piezoelectric layer stacked at a position closer to the base portion, in some cases. In this case, the piezoelectricity of the piezoelectric layer stacked at a position remote from the base portion is deteriorated, thus deteriorating the piezoelectricity of the device as a whole.

SUMMARY OF THE INVENTION

Preferred embodiments of the present invention provide piezoelectric devices with significantly improved piezoelectricity.

According to a preferred embodiment of the present invention, a piezoelectric device includes a base portion and a membrane portion. The base portion includes a first main surface and a second main surface. The second main surface is located on an opposite side of the base portion from the first main surface. The membrane portion includes a plurality of layers. The membrane portion is located adjacent to or in a vicinity of the second main surface of the base portion, is supported by the base portion, and is not superimposed on the base portion when viewed from the direction of the normal to the first main surface. The membrane portion includes a plurality of electrode layers, a first piezoelectric layer, and a second piezoelectric layer. The plurality of electrode layers are spaced apart from each other in the direction of the normal. The first piezoelectric layer is provided between two electrode layers of the plurality of electrode layers in the direction of the normal. The second piezoelectric layer is provided on an opposite side of the first piezoelectric layer from the base portion. The piezoelectric layer is interposed between two electrode layers of the plurality of electrode layers in the direction of the normal. The half-width of a rocking curve measured by X-ray diffraction for a lattice plane of the first piezoelectric layer parallel or substantially parallel to the first main surface is smaller than the half-width for the second piezoelectric layer. The piezoelectric constant of a material defining the first piezoelectric layer is smaller than the piezoelectric constant of a material defining the second piezoelectric layer.

According to a preferred embodiment of the present invention, a piezoelectric device includes a base portion and a membrane portion. The base portion includes a first main surface and a second main surface. The second main surface is located on an opposite side of the base portion from the first main surface. The membrane portion includes a plurality of layers. The membrane portion is located adjacent to or in a vicinity of the second main surface of the base portion, is supported by the base portion, and is not superimposed on the base portion when viewed from the direction of the normal to the first main surface. The membrane portion includes a plurality of electrode layers, a first piezoelectric layer, and a second piezoelectric layer. The plurality of electrode layers are spaced apart from each other in the direction of the normal. The first piezoelectric layer is interposed between two electrode layers of the plurality of electrode layers in the direction of the normal. The second piezoelectric layer is provided on an opposite side of the first piezoelectric layer from the base portion. The second piezoelectric layer is provided between two electrode layers of the plurality of electrode layers in the direction of the normal. The first piezoelectric layer includes aluminum nitride (AlN) as a main component. The second piezoelectric layer is made of aluminum nitride (AlN) having a higher dopant concentration than the first piezoelectric layer.

According to a preferred embodiment of the present invention, a piezoelectric device includes a base portion and a membrane portion. The base portion includes a first main surface and a second main surface. The second main surface is located on an opposite side of the base portion from the first main surface. The membrane portion includes a plurality of layers. The membrane portion is located adjacent to or in a vicinity of the second main surface of the base portion, is supported by the base portion, and is not superimposed on the base portion when viewed from the direction of the normal to the first main surface. The membrane portion includes a plurality of electrode layers, a first piezoelectric layer, and a second piezoelectric layer. The plurality of electrode layers are spaced apart from each other in the direction of the normal. The first piezoelectric layer is interposed between two electrode layers of the plurality of electrode layers in the direction of the normal. The second piezoelectric layer is provided on an opposite side of the first piezoelectric layer from the base portion. The second piezoelectric layer is provided between two electrode layers of the plurality of electrode layers in the direction of the normal. The first piezoelectric layer is made of aluminum nitride (AlN) including no dopant, except for incidental impurities. The second piezoelectric layer is made of aluminum nitride (AlN) including at least one dopant selected from scandium (Sc), niobium (Nb), and magnesium (Mg).

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Piezoelectric devices according to preferred embodiments of the present invention will be described below with reference to the attached drawings. In the description of the following preferred embodiments, the same or equivalent elements in the drawings are designated using the same reference numerals, and redundant description is not repeated.

First Preferred Embodiment

Figure 1:
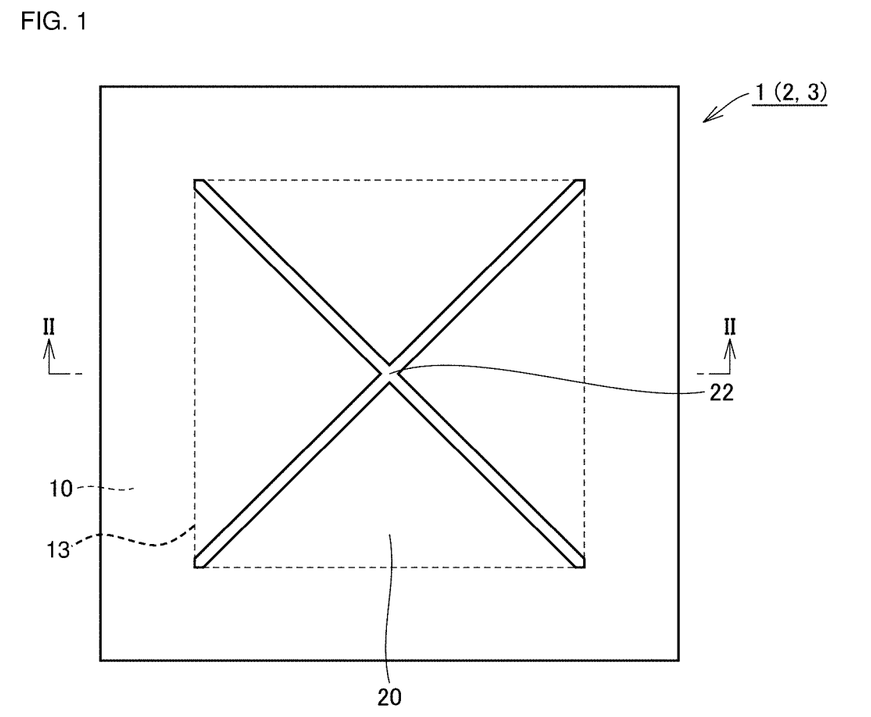
FIG. 1 is a plan view of a piezoelectric device according to a first preferred embodiment of the present invention.
Figure 2:
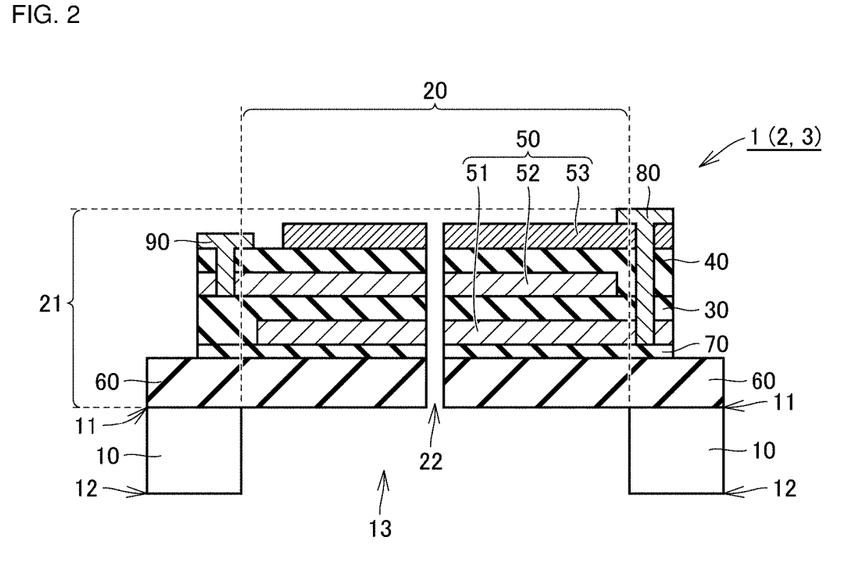
FIG. 2 is a cross-sectional view of the piezoelectric device taken along line II-II of FIG. 1 when viewed from a direction indicated by arrows.

FIG. 1 is a plan view of a piezoelectric device according to a first preferred embodiment of the present invention. FIG. 2 is a cross-sectional view of the piezoelectric device taken along line II-II of FIG. 1 when viewed from a direction indicated by arrows. As shown in FIGS. 1 and 2, a piezoelectric device 1 according to the first preferred embodiment of the present invention includes a base portion 10 and a membrane portion 20.

As shown in FIG. 2, the base portion 10 includes a first main surface 11 and a second main surface 12. The second main surface 12 is located on the opposite side of the base portion 10 from the first main surface 11. The base portion 10 includes an opening 13 penetrating from the first main surface 11 to the second main surface 12. FIGS. 1 and 2 show an outer boundary of the opening 13. The base portion 10 may be made of a freely-selected material. In the first preferred embodiment, the base portion 10 is preferably made of Si, for example.

Multiple layers 21 are stacked on the first main surface 11 of the base portion 10. The membrane portion 20 includes the multiple layers 21. The membrane portion 20 is located adjacent to or in a vicinity of the first main surface 11 of the base portion 10, is supported by the base portion 10, and is not superimposed on the base portion 10 when viewed from the direction of the normal to the first main surface 11. That is, in the first preferred embodiment, the membrane portion 20 is a portion of the multiple layers 21 superimposed on the opening 13 when viewed from the direction of the normal to the first main surface 11. The multiple layers 21 extend from the membrane portion 20 to the first main surface 11 of the base portion 10.

As shown in FIG. 2, the membrane portion 20 includes a through slit 22 penetrating through the membrane portion 20 in the direction of the normal to the first main surface 11. In the first preferred embodiment, the through slit 22 has a constant or substantially constant width from the upper end portion to the lower end portion.

In the first preferred embodiment, the membrane portion 20 includes a first piezoelectric layer 30, a second piezoelectric layer 40, multiple electrode layers 50, an intermediate layer 60, and a seed layer 70. That is, the multiple layers 21 including the membrane portion 20 includes the first piezoelectric layer 30, the second piezoelectric layer 40, the multiple electrode layers 50, the intermediate layer 60, and the seed layer 70. The multiple layers 21 are stacked on each other in the direction of the normal to the first main surface 11.

The first piezoelectric layer 30 is interposed between two electrode layers 51 and 52 of the multiple electrode layers 50 in the direction of the normal. Features of the first piezoelectric layer 30 will be described below.

The second piezoelectric layer 40 is interposed between two electrode layers 52 and 53 of the multiple electrode layers 50 in the direction of the normal. The second piezoelectric layer 40 is provided on the opposite side of the first piezoelectric layer 30 from the base portion 10. Features of the second piezoelectric layer 40 will be described below.

The multiple electrode layers 50 are spaced apart from each other in the direction of the normal. In the first preferred embodiment, the multiple electrode layers 50 include a first electrode layer 51, a second electrode layer 52, and a third electrode layer 53. The first electrode layer 51 is located on a side of the first piezoelectric layer 30 adjacent to or in a vicinity of the base portion 10. The second electrode layer 52 is located on the opposite side of the first piezoelectric layer 30 from the base portion 10 and on a side of the second piezoelectric layer 40 adjacent to or in a vicinity of the base portion 10. The third electrode layer 53 is located on the opposite side of the second piezoelectric layer 40 from the base portion 10.

Each of the first electrode layer 51 and the second electrode layer 52 is preferably made of a metal, for example, Mo or W. The third electrode layer 53 is preferably made of a metal, for example, Mo, W, Al, or Ti. A close-contact layer preferably made of Ti, NiCr, or the like, for example, may be provided between each of the multiple electrode layers 50 and its adjacent layer.

The intermediate layer 60 is provided on the first main surface 11 of the base portion 10. The intermediate layer 60 is preferably made of a dielectric material, for example, $SiO_2$.

Figure 3:
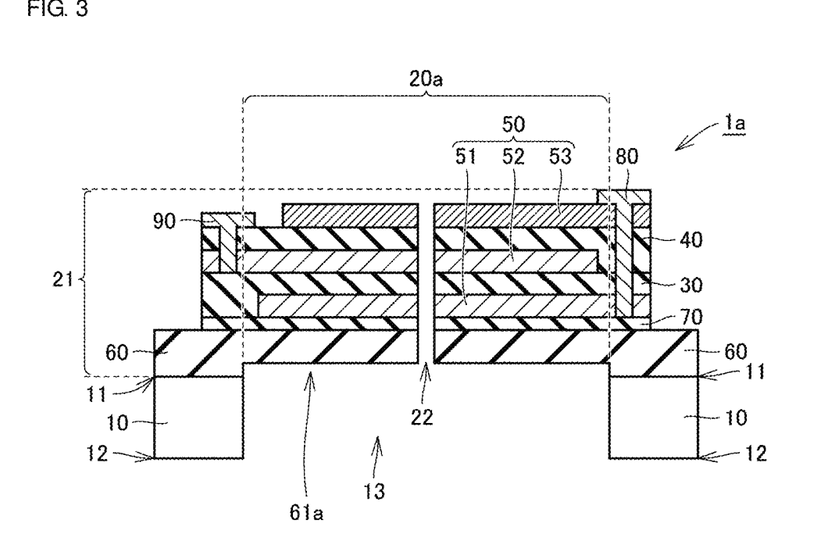
FIG. 3 is a cross-sectional view of a piezoelectric device according to a first modification of the first preferred embodiment of the present invention.

While the outer shape of the intermediate layer 60 has a substantially flat plate shape in the first preferred embodiment, the outer shape of the intermediate layer 60 is not particularly limited thereto. FIG. 3 is a cross-sectional view of a piezoelectric device according to a first modification of the first preferred embodiment of the present invention. A piezoelectric device 1a according to the first modification of the first preferred embodiment of the present invention includes a recessed portion 61a facing the opening 13 of the base portion 10. Thus, a membrane portion 20a has a smaller thickness than the membrane portion 20 according to the first preferred embodiment of the present invention.

Figure 4:
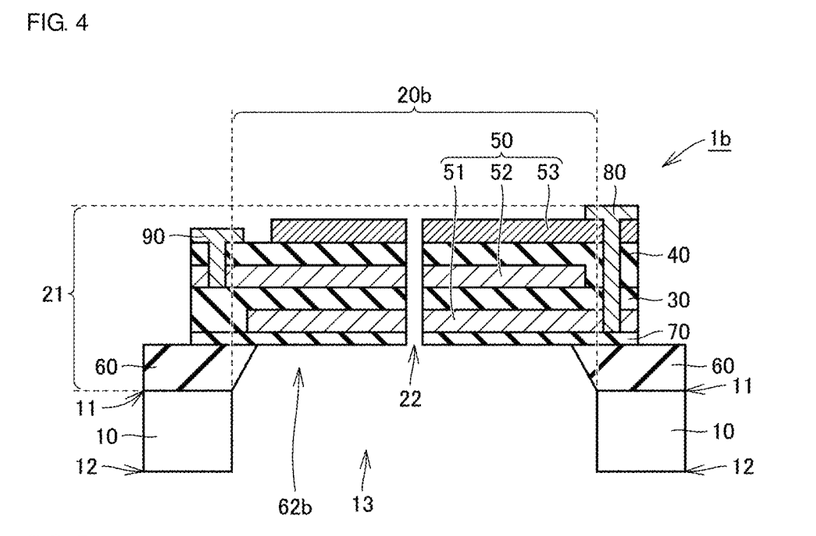
FIG. 4 is a cross-sectional view of a piezoelectric device according to a second modification of the first preferred embodiment of the present invention.

FIG. 4 is a cross-sectional view of a piezoelectric device according to a second modification of the first preferred embodiment of the present invention. A piezoelectric device 1b according to the second modification of the first preferred embodiment of the present invention includes a second opening 62b continuous with the opening 13 of the base portion 10. Thus, a membrane portion 20b has a smaller thickness than the membrane portion 20a according to the first modification of the first preferred embodiment of the present invention. The width of the second opening 62b decreases with increasing distance from the base portion 10.

As shown in FIG. 2, the seed layer 70 according to the first preferred embodiment of the present invention is located on the opposite side of the intermediate layer 60 from the base portion 10 and located closer to the base portion 10 than the first electrode layer 51. The first electrode layer 51 in the first preferred embodiment is located on the opposite side of the seed layer from the base portion 10.

The seed layer 70 is made of a dielectric material. The seed layer 70 may be made of a material having piezoelectricity. The seed layer 70 in the first preferred embodiment is preferably made of, for example, aluminum nitride (AlN) including no dopant, except for incidental impurities. Aluminum nitride (AlN) including no dopant has better crystallinity than aluminum nitride including a dopant.

The multiple layers 21 further include a first connection electrode 80 and a second connection electrode 90. Each of the first connection electrode 80 and the second connection electrode 90 extends from the opposite side of the third electrode layer 53 from the base portion 10 to penetrate in the stacking direction of the multiple layers 21. The first connection electrode 80 is electrically connected to the first electrode layer and the third electrode layer 53. The second connection electrode 90 is electrically connected to the second electrode layer 52. Each of the first connection electrode 80 and the second connection electrode 90 is preferably made of a metal, for example, Al.

The structures of the first piezoelectric layer 30 and the second piezoelectric layer 40 will be described below.

In the first preferred embodiment, the first piezoelectric layer 30 preferably includes, for example, aluminum nitride (AlN) as a main component. In the present specification, in the case where a certain layer "includes aluminum nitride as a main component", the aluminum nitride content of the certain layer is preferably, for example, about 70% or more when the aluminum nitride content is expressed in atomic concentration (%) based on all the components defining the certain layer. The first piezoelectric layer 30 preferably includes at least one dopant selected from scandium (Sc), niobium (Nb), and magnesium (Mg), for example. Preferably, the first piezoelectric layer 30 is made of, for example, aluminum nitride (AlN) including at least one dopant selected from scandium (Sc), niobium (Nb), and magnesium (Mg). More preferably, the first piezoelectric layer 30 is made of, for example, aluminum nitride (AlN) including at least scandium (Sc) defining and functioning as a dopant.

Accordingly, the piezoelectric constant of a material defining the first piezoelectric layer 30 is more than about 5 pC/N, which is the value of the piezoelectric constant $d_{33}$ of aluminum nitride (AlN) including no dopant, except for incidental impurities. As will be described below, the piezoelectric constant of the material of the first piezoelectric layer 30 is larger than that of a material defining the second piezoelectric layer 40.

In the first preferred embodiment, when the ratio of Sc to Al to N in the material defining the first piezoelectric layer 30 is $X_1:(1-Y_1):1$, $X_1$ is preferably about 0.01 or more and about 0.25 or less, for example, and more preferably about 0.05 or more and about 0.07 or less, for example. $Y_1$ may be equal or substantially equal to the value of $X_1$. When aluminum nitride defining and functioning as a main component of the first piezoelectric layer 30 includes a dopant other than Sc, $Y_1$ may be more than the value of $X_1$ and less than about 1. At a larger value of $X_1$, the aluminum nitride has a higher piezoelectric constant but lower crystallinity. However, when the value of X is more than about 0.40, a larger value of $X_1$ results in a lower piezoelectric constant.

The half-width of a rocking curve measured by X-ray diffraction (XRD) for the lattice plane of the first piezoelectric layer 30 parallel or substantially parallel to the first main surface 11 is preferably about 0.5° or more and about 4° or less, for example. The half-width of the rocking curve is measured as follows: 2θ/ω scans of a target layer to be measured are performed with an X-ray diffractometer to measure a diffraction peak corresponding to a specific lattice plane. An angle between an incident X-ray beam and a crystal surface is defined as ω, and an angle between the direction of an incident X-ray beam and the direction of a detector is defined as 2θ. After the diffraction peak is measured, an ω-scan is performed while the detector is fixed to measure a diffraction peak. The half-width of the resulting diffraction peak is defined as the half-width of the rocking curve. The half-width is the full width at half maximum (FWHM). In the case of measuring the half-width of a layer including aluminum nitride as a main component, the half-width of the rocking curve for a diffraction peak in the [002] direction is measured.

In the first preferred embodiment, the seed layer 70 is preferably made of, for example, aluminum nitride (AlN) including no dopant, except for incidental impurities, and the first piezoelectric layer 30 is preferably made of, for example, aluminum nitride (AlN) including at least scandium (Sc) defining and functioning as a dopant. Thus, the half-width of the first piezoelectric layer 30 is larger than that of the seed layer 70.

In the first preferred embodiment, the second piezoelectric layer 40 preferably includes, for example, aluminum nitride (AlN) as a main component. The second piezoelectric layer 40 preferably includes, for example, at least one dopant selected from scandium (Sc), niobium (Nb), and magnesium (Mg). Preferably, the second piezoelectric layer 40 is made of, for example, aluminum nitride (AlN) including at least one dopant selected from scandium (Sc), niobium (Nb), and magnesium (Mg). More preferably, the second piezoelectric layer 40 is made of, for example, aluminum nitride (AlN) including at least scandium (Sc) as a dopant.

The ratio of Sc to Al to N of the second piezoelectric layer 40 differs from the ratio of Sc to Al to N of the first piezoelectric layer 30. In the first preferred embodiment, the second piezoelectric layer 40 includes aluminum nitride (AlN) having a higher dopant concentration than the first piezoelectric layer 30. Specifically, the second piezoelectric layer 40 includes aluminum nitride (AlN) having a higher scandium (Sc) concentration than the first piezoelectric layer 30. Thus, the piezoelectric constant of the material defining the second piezoelectric layer is higher than the piezoelectric constant of the material defining the first piezoelectric layer 30. In the first preferred embodiment, the piezoelectric constant $d_{33}$ of the material defining the second piezoelectric layer 40 is, for example, more than about 25 pC/N.

In the first preferred embodiment, when the ratio of Sc to Al to N in the material defining the second piezoelectric layer 40 is $X_2:(1-Y_2):1$, the value of $X_2$ in the second piezoelectric layer 40 is larger than the value of $X_2$ in the first piezoelectric layer 30. The value of $X_2$ in the second piezoelectric layer 40 is preferably about 0.40 or less, for example.

In the first preferred embodiment, the half-width of a rocking curve measured by X-ray diffraction for the lattice plane of the first piezoelectric layer 30 parallel or substantially parallel to the first main surface 11 is smaller than that in the second piezoelectric layer 40. Preferably, the half-width for the second piezoelectric layer 40 is, for example, about 0.1° or more larger than that in the first piezoelectric layer 30, or is, for example, about 10% or more larger than the value of the half-width for the first piezoelectric layer 30. The difference between the half-width for the second piezoelectric layer 40 and the half-width for the first piezoelectric layer 30 is about 2° or less or about 200% or less of the value of the half-width for the first piezoelectric layer 30.

A non-limiting example of a method for producing a piezoelectric device according to the first preferred embodiment of the present invention will be described below.

Figure 5:
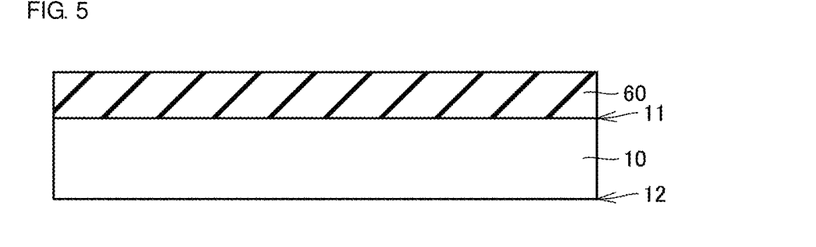
FIG. 5 is a cross-sectional view showing a state in which an intermediate layer is formed on a base portion in a method to produce a piezoelectric device according to the first preferred embodiment of the present invention.

FIG. 5 is a cross-sectional view showing a state in which an intermediate layer 60 is formed on a base portion in the method for producing a piezoelectric device according to the first preferred embodiment of the present invention. As shown in FIG. 5, the intermediate layer is formed on the first main surface 11 of the base portion 10.

Figure 6:
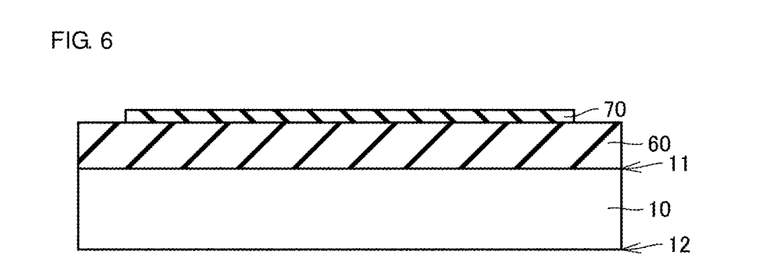
FIG. 6 is a cross-sectional view showing a state in which a seed layer is formed on the intermediate layer in the method to produce a piezoelectric device according to the first preferred embodiment of the present invention.

FIG. 6 is a cross-sectional view showing a state in which a seed layer is formed on the intermediate layer in the method for producing a piezoelectric device according to the first preferred embodiment of the present invention. As shown in FIG. 6, the seed layer 70 is formed on the opposite side of the intermediate layer 60 from the base portion 10.

Figure 7:
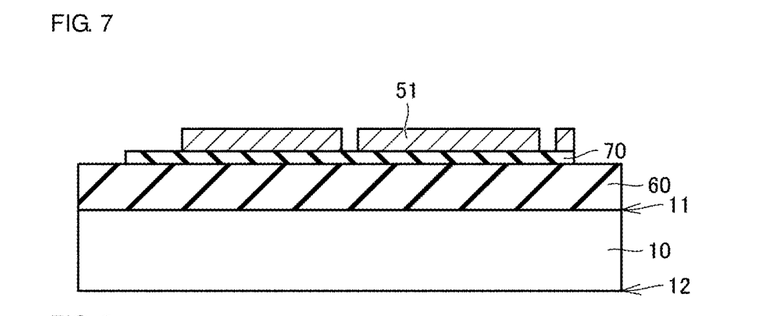
FIG. 7 is a cross-sectional view showing a state in which a first electrode layer is formed on the seed layer in the method to produce a piezoelectric device according to the first preferred embodiment of the present invention.

FIG. 7 is a cross-sectional view showing a state in which a first electrode layer is formed on the seed layer in the method for producing a piezoelectric device according to the first preferred embodiment of the present invention. As shown in FIG. 7, a film is formed by a photolithographic method, and then a resist pattern is formed. Deep reactive ion etching (RIE) is performed to form the first electrode layer 51 on the opposite side of the seed layer 70 from the intermediate layer 60.

Figure 8:
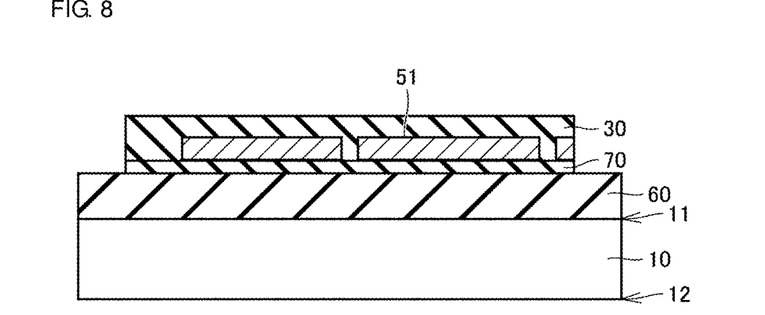
FIG. 8 is a cross-sectional view showing a state in which a first piezoelectric layer is formed on the first electrode layer and the seed layer in the method to produce a piezoelectric device according to the first preferred embodiment of the present invention.

FIG. 8 is a cross-sectional view showing a state in which a first piezoelectric layer is formed on the first electrode layer and the seed layer in the method for producing a piezoelectric device according to the first preferred embodiment of the present invention. As shown in FIG. 8, a film is formed by a photolithographic method, and then a resist pattern is formed. RIE is performed, and the first piezoelectric layer 30 is formed on the opposite side of the first electrode layer 51 from the seed layer 70 and covers the first electrode layer 51. The seed layer is stacked, and then the first piezoelectric layer 30 is stacked; thus, the crystallinity of the first piezoelectric layer is lower than that of the seed layer 70 owing to the misorientation of the first piezoelectric layer 30.

Figure 9:
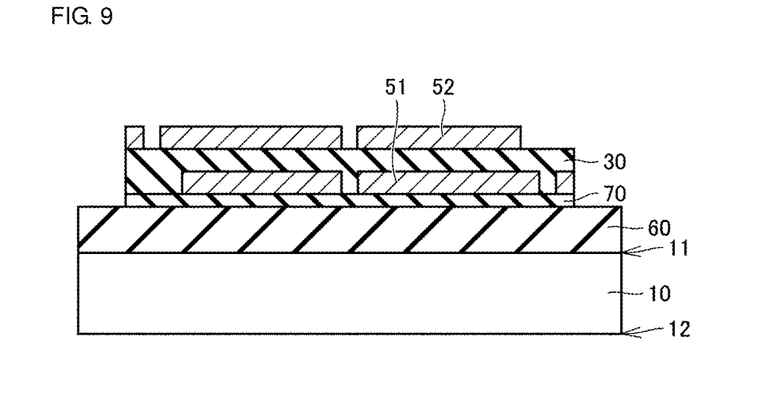
FIG. 9 is a cross-sectional view showing a state in which a second electrode layer is formed on the first piezoelectric layer in the method to produce a piezoelectric device according to the first preferred embodiment of the present invention.

FIG. 9 is a cross-sectional view showing a state in which a second electrode layer is formed on the first piezoelectric layer in the method for producing a piezoelectric device according to the first preferred embodiment of the present invention. As shown in FIG. 9, a film is formed by a photolithographic method, and then a resist pattern is formed. RIE is performed to form the second electrode layer 52 on the opposite side of the first piezoelectric layer 30 from the seed layer 70.

Figure 10:
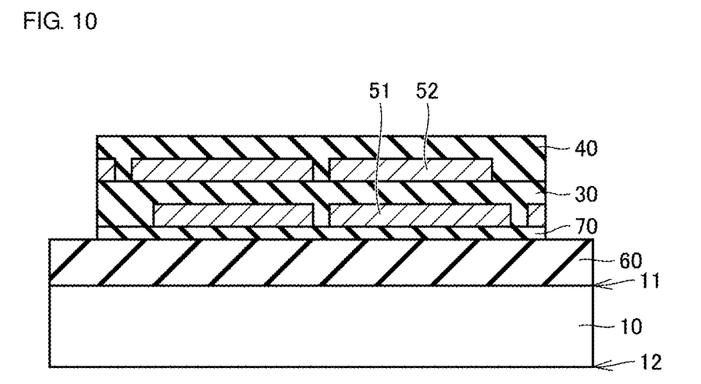
FIG. 10 is a cross-sectional view showing a state in which a second piezoelectric layer is formed on the second electrode layer and the first piezoelectric layer in the method to produce a piezoelectric device according to the first preferred embodiment of the present invention.

FIG. 10 is a cross-sectional view showing a state in which a second piezoelectric layer is formed on the second electrode layer and the first piezoelectric layer in the method for producing a piezoelectric device according to the first preferred embodiment of the present invention. As shown in FIG. 10, a film is formed by a photolithographic method, and then a resist pattern is formed. RIE is performed, and the second piezoelectric layer 40 is formed on the opposite side of the second electrode layer 52 from the first piezoelectric layer 30 and covers the second electrode layer 52. The first piezoelectric layer 30, and then the second piezoelectric layer 40 is stacked; thus, the crystallinity of the second piezoelectric layer 40 is lower than that of the first piezoelectric layer 30 owing to the misorientation of the second piezoelectric layer 40.

Figure 11:
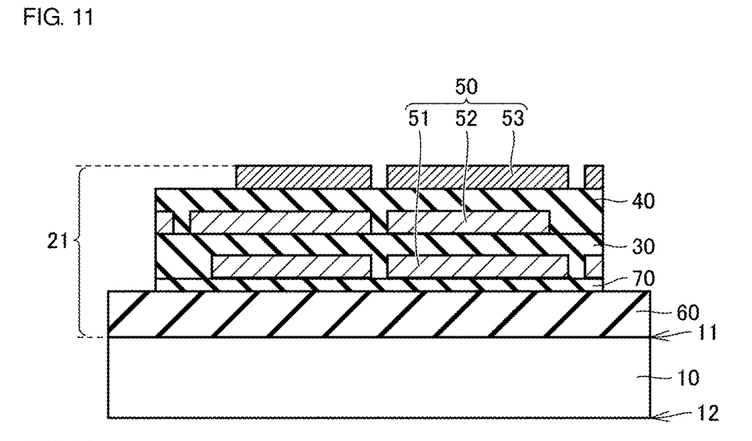
FIG. 11 is a cross-sectional view showing a state in which a third electrode layer is formed on the second piezoelectric layer in the method to produce a piezoelectric device according to the first preferred embodiment of the present invention.

FIG. 11 is a cross-sectional view showing a state in which a third electrode layer is formed on the second piezoelectric layer in the method for producing a piezoelectric device according to the first preferred embodiment of the present invention. As shown in FIG. 11, a film is formed by a photolithographic method, and then a resist pattern is formed. RIE is performed to form the third electrode layer 53 on the opposite side of the second piezoelectric layer 40 from the first piezoelectric layer 30.

Figure 12:
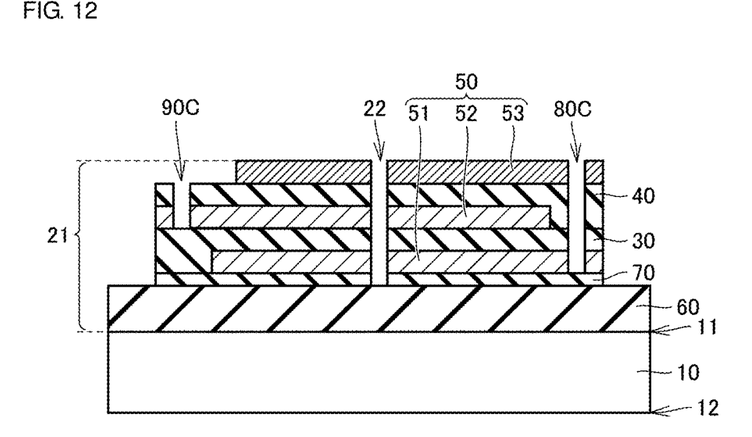
FIG. 12 is a cross-sectional view showing a state in which a through slit is formed in the method to produce a piezoelectric device according to the first preferred embodiment of the present invention.

FIG. 12 is a cross-sectional view showing a state in which a through slit is formed in the method for producing a piezoelectric device according to the first preferred embodiment of the present invention. As shown in FIG. 12, a resist pattern is formed, and then RIE is performed to form the through slit 22 in the stacked multiple layers 21. Additionally, a first trench 80C to be filled with a first connection electrode and a second trench 90C are formed simultaneously with the formation of the through slit 22.

Figure 13:
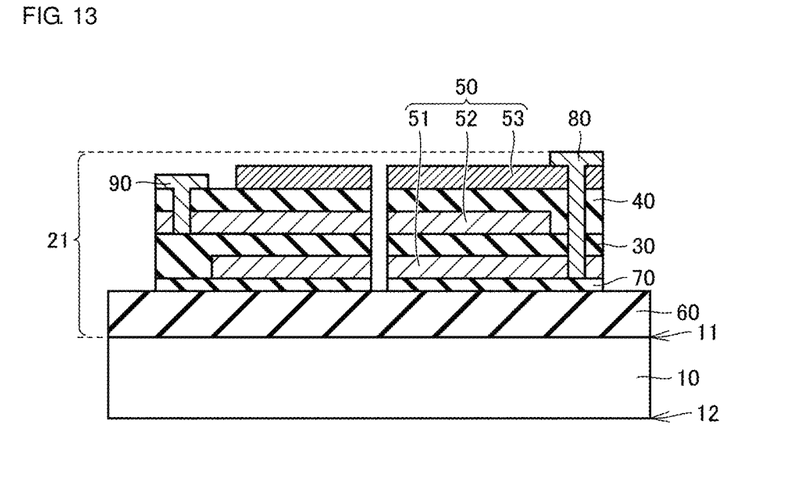
FIG. 13 is a cross-sectional view showing a state in which a connection electrode is formed in the method to produce a piezoelectric device according to the first preferred embodiment of the present invention.

FIG. 13 is a cross-sectional view showing a state in which the connection electrode is formed in the method for producing a piezoelectric device according to the first preferred embodiment of the present invention. As shown in FIG. 13, a resist pattern is formed by a photolithographic method. By a lift-off process, the first connection electrode 80 is formed in the first trench 80C, and the second connection electrode 90 is formed in the second trench 90C.

Finally, a resist pattern is formed on the second main surface 12 of the base portion 10 by a photolithographic method. Then deep reactive ion etching (DRIE) is performed from the second main surface 12 of the base portion 10 to form the opening 13 shown in FIG. 2. As shown in FIG. 2, the piezoelectric device 1 according to the first preferred embodiment of the present invention is produced through the above steps.

As described above, in the piezoelectric device 1 according to the first preferred embodiment of the present invention, the half-width of the rocking curve measured by X-ray diffraction for the lattice plane of the first piezoelectric layer 30 parallel or substantially parallel to the first main surface 11 is smaller than that in the second piezoelectric layer 40. The piezoelectric constant of the material defining the first piezoelectric layer 30 is lower than that of the material defining the second piezoelectric layer 40.

Thus, the piezoelectric device 1 is able to be provided with significantly improved piezoelectricity. Specifically, the first piezoelectric layer 30 provided adjacent to or in a vicinity of the base portion 10 has significantly improved piezoelectricity due to its high crystallinity. Furthermore, the second piezoelectric layer 40 has a high piezoelectric constant and thus is able to significantly reduce or prevent a decrease in the piezoelectricity of the second piezoelectric layer 40.

In the first preferred embodiment, the first piezoelectric layer 30 includes, for example, aluminum nitride (AlN) as a main component.

Thus, the c-axis of aluminum nitride included in the first piezoelectric layer 30 is self-oriented in a direction perpendicular or substantially perpendicular to the first main surface 11. Thus, the piezoelectricity is able to be easily controlled by the inclusion of aluminum nitride. Accordingly, the piezoelectric device 1 is able to be provided with further significantly improved device characteristics.

In the first preferred embodiment, the second piezoelectric layer 40 includes, for example, aluminum nitride (AlN) as a main component. The ratio of Sc to Al to N of the second piezoelectric layer 40 differs from the ratio of Sc to Al to N of the first piezoelectric layer 30.

Thus, even if the first piezoelectric layer 30 and the second piezoelectric layer 40 include an identical or substantially identical main component, the piezoelectric constant of a material defining the second piezoelectric layer 40 is higher than the piezoelectric constant of a material defining the first piezoelectric layer 30; thus, the piezoelectric device 1 is able to be provided with significantly improved device characteristics.

In the first preferred embodiment, the second piezoelectric layer 40 includes, for example, at least one dopant selected from scandium (Sc), niobium (Nb), and magnesium (Mg).

Thus, the second piezoelectric layer 40 including aluminum nitride as a main component is able to have a higher piezoelectric constant.

In the first preferred embodiment, the second piezoelectric layer 40 is made of, for example, aluminum nitride (AlN) including scandium (Sc) as a dopant.

Thus, the second piezoelectric layer 40 may be made of aluminum nitride having a higher piezoelectric constant than aluminum nitride including another element as a dopant.

The half-width for the first piezoelectric layer 30 is about 0.5° or more and about 4° or less, for example. That is, the first piezoelectric layer 30 has good crystallinity, so that the second piezoelectric layer 40 is able to be provided with significantly improved piezoelectricity.

The half-width for the second piezoelectric layer 40 is, for example, about 0.1° or more larger than the half-width for the first piezoelectric layer 30 or is about 10% or more larger than the half-width for the first piezoelectric layer 30.

Thus, even if the crystallinity of the second piezoelectric layer 40 is lower than that of the first piezoelectric layer 30, the material that defines the second piezoelectric layer 40 and that has a higher piezoelectric constant than the first piezoelectric layer 30 is provided as described above, so that a decrease in the piezoelectricity of the second piezoelectric layer 40 is able to be significantly reduced or prevented.

In the first preferred embodiment, the first piezoelectric layer 30 includes, for example, aluminum nitride (AlN) as a main component. The second piezoelectric layer 40 is made of, for example, aluminum nitride (AlN) having a higher dopant concentration than the first piezoelectric layer 30.

Thus, the piezoelectric device 1 is able to be provided with significantly improved piezoelectricity. Specifically, even if the first piezoelectric layer 30 and the second piezoelectric layer 40 include materials including an identical or substantially identical main component, the second piezoelectric layer 40 has a higher piezoelectric constant, and thus a decrease in the piezoelectricity of the second piezoelectric layer 40 is able to be significantly reduced or prevented.

Second Preferred Embodiment

A piezoelectric device according to a second preferred embodiment of the present invention will be described below. The piezoelectric device according to the second preferred embodiment of the present invention differs from the piezoelectric device 1 according to the first preferred embodiment of the present invention in materials defining the first piezoelectric layer 30, the second piezoelectric layer 40, and the seed layer 70. Descriptions of the same or similar features, components, and elements as the piezoelectric device 1 according to the first preferred embodiment of the present invention are not redundantly repeated. As shown in FIGS. 1 and 2, a piezoelectric device 2 according to the second preferred embodiment of the present invention has the same or substantially the same outer shape as the piezoelectric device 1 according to the first preferred embodiment of the present invention.

In the piezoelectric device 2 according to the second preferred embodiment of the present invention, the first piezoelectric layer 30 is made of, for example, aluminum nitride (AlN) including no dopant, except for incidental impurities. Thus, the first piezoelectric layer 30 has good crystallinity and is able to be provided with significantly improved piezoelectricity.

In the second preferred embodiment, the first piezoelectric layer 30 is made of, for example, aluminum nitride (AlN) including no dopant, except for incidental impurities, and the second piezoelectric layer 40 is made of, for example, aluminum nitride (AlN) including at least one dopant selected from scandium (Sc), niobium (Nb), and magnesium (Mg).

Thus, also in the second preferred embodiment, the piezoelectric device 2 has significantly improved piezoelectricity. Specifically, even if the first piezoelectric layer 30 and the second piezoelectric layer 40 include materials including the same or substantially the same main component, the first piezoelectric layer 30 provided adjacent to or in a vicinity of the base portion 10 has significantly improved piezoelectricity due to its high crystallinity. Furthermore, the second piezoelectric layer 40 has a high piezoelectric constant and thus is able to significantly reduce or prevent a decrease in the piezoelectricity of the second piezoelectric layer 40.

In the second preferred embodiment, the second piezoelectric layer 40 is made of, for example, aluminum nitride (AlN) including at least scandium (Sc) as a dopant. The Sc content is not particularly limited. When the ratio of Sc to Al to N in a material defining the second piezoelectric layer 40 is $X_2:(1-Y_2):1$, $X_2$ is preferably about 0.01 or more and about 0.25 or less, for example, and more preferably about 0.05 or more and about 0.07 or less, for example.

In the second preferred embodiment, the seed layer 70 includes a material that does not have piezoelectricity.

Third Preferred Embodiment

A piezoelectric device according to a third preferred embodiment of the present invention will be described below. The piezoelectric device according to the third preferred embodiment of the present invention differs from the piezoelectric device 1 according to the first preferred embodiment of the present invention in materials defining the first piezoelectric layer 30 and the second piezoelectric layer 40. Descriptions of the same or similar features, components, and elements as the piezoelectric device 1 according to the first preferred embodiment of the present invention are not redundantly repeated. As shown in FIGS. 1 and 2, a piezoelectric device 3 according to the third preferred embodiment of the present invention has the same or substantially the same outer shape as the piezoelectric device 1 according to the first preferred embodiment of the present invention.

In the piezoelectric device 3 according to the third preferred embodiment of the present invention, each of the first piezoelectric layer 30 and the second piezoelectric layer 40 is made of, for example, aluminum nitride (AlN) including no dopant, except for incidental impurities. In the third preferred embodiment, the ratio of aluminum nitride included in the first piezoelectric layer 30 differs from the ratio of aluminum nitride included in the second piezoelectric layer 40. Thus, even if the first piezoelectric layer 30 and the second piezoelectric layer 40 include the same or substantially the same main component, the piezoelectric constant of a material defining the second piezoelectric layer 40 is able to be higher than the piezoelectric constant of a material defining the first piezoelectric layer 30.

In the third preferred embodiment, the first piezoelectric layer 30 and the second piezoelectric layer 40 are deposited by reactive sputtering with an Al target. The ratio of AlN included in the first piezoelectric layer 30 and the second piezoelectric layer 40 is able to be controlled by, for example, the back pressure, the sputtering pressure, the flow rate of an inert gas including, for example, Ar and $N_2$, the flow ratio of Ar to $N_2$, the deposition temperature, and the sputtering power in the reactive sputtering.

In the description of the foregoing preferred embodiments, features, components, and elements may be combined with each other.

The preferred embodiments disclosed herein are only exemplary in all aspects and are not restrictive. The scope of the present invention is shown by the scope of the claims and not by the above description, and it is intended that meanings equivalent to the scope of the claims and all variations within the scope are included.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A piezoelectric device, comprising:
   a base portion including a first main surface and a second main surface on an opposite side of the base portion from the first main surface; and
   a membrane portion including a plurality of layers, being adjacent to or in a vicinity of the first main surface of the base portion, being supported by the base portion, and being not superimposed on the base portion when viewed from a direction of a normal to the first main surface; wherein
   the membrane portion includes:
     a plurality of electrode layers spaced apart from each other in the direction of the normal;
     a first piezoelectric layer interposed between two electrode layers of the plurality of electrode layers in the direction of the normal; and
     a second piezoelectric layer provided on an opposite side of the first piezoelectric layer from the base portion and interposed between two electrode layers of the plurality of electrode layers in the direction of the normal;
   a half-width of a rocking curve measured by X-ray diffraction for a lattice plane of the first piezoelectric layer parallel or substantially parallel to the first main surface is smaller than a half-width for the second piezoelectric layer;
   each of the first piezoelectric layer and the second piezoelectric layer includes aluminum nitride (AlN) as a main component;
   the second piezoelectric layer has a higher dopant concentration than the first piezoelectric layer; and
   a piezoelectric constant of a material defining the first piezoelectric layer is smaller than a piezoelectric constant of a material defining the second piezoelectric layer.

2. The piezoelectric device according to claim 1, wherein the second piezoelectric layer has a ratio of aluminum nitride different from the first piezoelectric layer.

3. The piezoelectric device according to claim 1, wherein the second piezoelectric layer includes at least one dopant selected from scandium (Sc), niobium (Nb), and magnesium (Mg).

4. The piezoelectric device according to claim 3, wherein the second piezoelectric layer is made of aluminum nitride (AlN) including at least scandium (Sc) as the at least one dopant.

5. The piezoelectric device according to claim 1, wherein the first piezoelectric layer is made of aluminum nitride (AlN) including no dopant, except for incidental impurities.

6. The piezoelectric device according to claim 1, wherein the half-width for the first piezoelectric layer is about 0.5° or more and about 4° or less.

7. The piezoelectric device according to claim 6, wherein the half-width for the second piezoelectric layer is about 0.1° or more larger than the half-width for the first piezoelectric layer or is about 10% or more larger than the half-width for the first piezoelectric layer.

8. A piezoelectric device, comprising:
a base portion including a first main surface and a second main surface on an opposite side of the base portion from the first main surface; and
a membrane portion including a plurality of layers, being adjacent to or in a vicinity of the first main surface of the base portion, being supported by the base portion, and being not superimposed on the base portion when viewed from a direction of a normal to the first main surface; wherein
the membrane portion includes:
a plurality of electrode layers spaced apart from each other in the direction of the normal;
a first piezoelectric layer interposed between two electrode layers of the plurality of electrode layers in the direction of the normal; and
a second piezoelectric layer provided on an opposite side of the first piezoelectric layer from the base portion and interposed between two electrode layers of the plurality of electrode layers in the direction of the normal;
the first piezoelectric layer includes aluminum nitride (AlN) as a main component; and
the second piezoelectric layer is made of aluminum nitride (AlN) having a higher dopant concentration than the first piezoelectric layer.

9. A piezoelectric device, comprising:
a base portion including a first main surface and a second main surface on an opposite side of the base portion from the first main surface; and
a membrane portion including a plurality of layers, being adjacent to or in a vicinity of the first main surface of the base portion, being supported by the base portion, and being not superimposed on the base portion when viewed from a direction of a normal to the first main surface; wherein
the membrane portion includes:
a plurality of electrode layers spaced apart from each other in the direction of the normal;
a first piezoelectric layer interposed between two electrode layers of the plurality of electrode layers in the direction of the normal; and
a second piezoelectric layer provided on an opposite side of the first piezoelectric layer from the base portion and interposed between two electrode layers of the plurality of electrode layers in the direction of the normal;
the first piezoelectric layer is made of aluminum nitride (AlN) including no dopant, except for incidental impurities; and
the second piezoelectric layer is made of aluminum nitride (AlN) including at least one dopant selected from scandium (Sc), niobium (Nb), and magnesium (Mg).

10. The piezoelectric device according to claim 1, wherein the membrane portion includes a slit that penetrates through the membrane portion in the direction of the normal.

11. The piezoelectric device according to claim 10, wherein the slit has a constant or substantially constant width through the membrane portion.

12. The piezoelectric device according to claim 1, wherein
the membrane portion includes an intermediate layer provided on the first main surface of the base portion; and
the intermediate layer includes a dielectric material.

13. The piezoelectric device according to claim 12, wherein
the membrane portion includes a seed layer located on an opposite side of the intermediate layer from the base portion; and
the seed layer includes a dielectric material.

14. The piezoelectric device according to claim 13, wherein the seed layer includes a piezoelectric material.

15. The piezoelectric device according to claim 13, wherein the seed layer includes aluminum nitride (AlN) including no dopant, except for incidental impurities.

16. The piezoelectric device according to claim 1, wherein
the plurality of electrode layers includes at least a first electrode layer, a second electrode layer, and a third electrode layer stacked in this order;
the membrane portion includes a first connection electrode and a second connection electrode;
the first connection electrode is electrically connected to the first electrode layer and the third electrode layer; and
the second connection electrode is electrically connected to the second electrode layer.

* * * * *